United States Patent [19]

George

[11] Patent Number: 5,682,284

[45] Date of Patent: Oct. 28, 1997

[54] READ SENSITIVITY FUNCTION FOR BARBERPOLE BIAS DESIGN MAGNETORESISTIVE SENSOR HAVING CURVED CURRENT CONTACTS

[75] Inventor: Peter K. George, Bloomington, Minn.

[73] Assignee: Seagate Technology, Inc., Scotts Valley, Calif.

[21] Appl. No.: 483,118

[22] Filed: Jun. 7, 1995

Related U.S. Application Data

[63] Continuation-in-part of Ser. No. 188,079, Jan. 27, 1994, abandoned, which is a continuation-in-part of Ser. No. 936,185, Aug. 25, 1992, abandoned.

[51] Int. Cl.$^6$ .................................................. G11B 5/39
[52] U.S. Cl. ...................... 360/113; 324/252; 338/32 R
[58] Field of Search ............................ 360/113; 324/252; 338/32 R

[56] References Cited

U.S. PATENT DOCUMENTS

| | | | |
|---|---|---|---|
| Re. 34,099 | 10/1992 | Krounbi et al. | 360/113 |
| 4,048,557 | 9/1977 | Chen | 324/46 |
| 4,068,272 | 1/1978 | Kanai et al. | 360/113 |
| 4,071,868 | 1/1978 | Kaminaka et al. | 360/113 |
| 4,580,175 | 4/1986 | Mowry et al. | 360/113 |
| 4,843,505 | 6/1989 | Mowry | 360/113 |
| 4,967,298 | 10/1990 | Mowry | 360/113 |
| 5,193,039 | 3/1993 | Smith et al. | 360/113 |
| 5,206,590 | 4/1993 | Dieny et al. | 324/252 |
| 5,260,652 | 11/1993 | Collver et al. | 324/252 |
| 5,262,914 | 11/1993 | Chen et al. | 360/113 |
| 5,325,253 | 6/1994 | Chen et al. | 360/113 |
| 5,351,158 | 9/1994 | Shibata | 360/113 |
| 5,420,736 | 5/1995 | Heim et al. | 360/113 |

FOREIGN PATENT DOCUMENTS

| | | | |
|---|---|---|---|
| 59-198519 | 11/1984 | Japan | 360/113 |
| 61-170918 | 8/1986 | Japan | 360/113 |
| 61-243922 | 10/1986 | Japan | 360/113 |

*Primary Examiner*—A. J. Heinz
*Assistant Examiner*—Brian E. Miller
*Attorney, Agent, or Firm*—Kinney & Lange, P.A.

[57] ABSTRACT

An improved magnetoresistive head design including a front curved sense contact, a back curved sense contact and a lip extension forming an elliptical sensor region is disclosed. Current flows perpendicularly to the contact edges and intersects the MR element's magnetization vector at 45 degrees. A symmetrical read sensitivity function is the result of constant magnetic flux associated with an elliptical sense region.

15 Claims, 3 Drawing Sheets

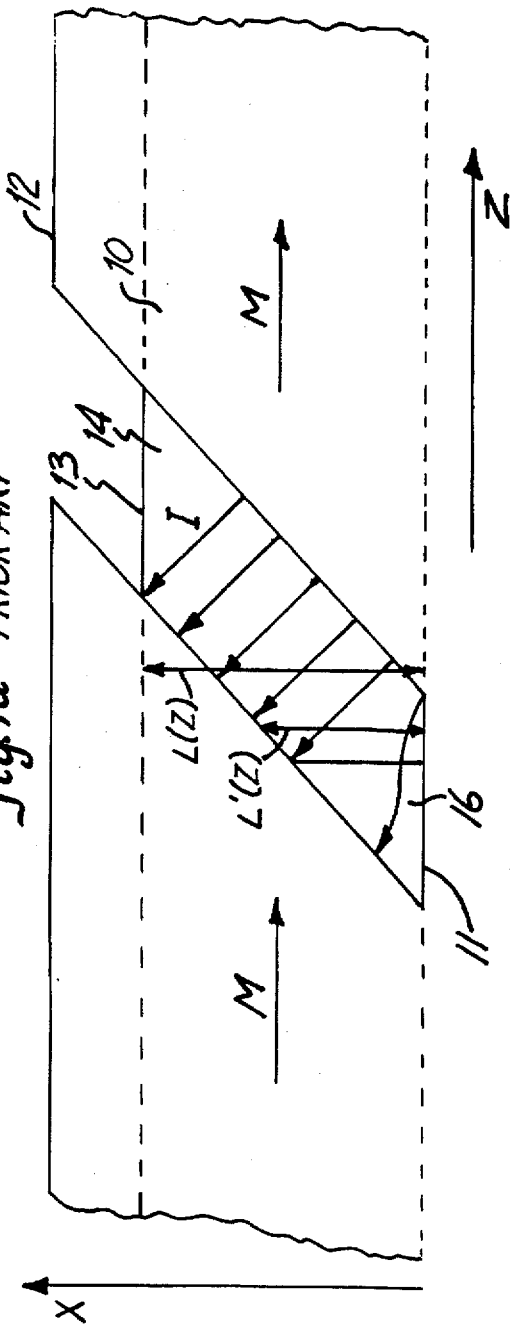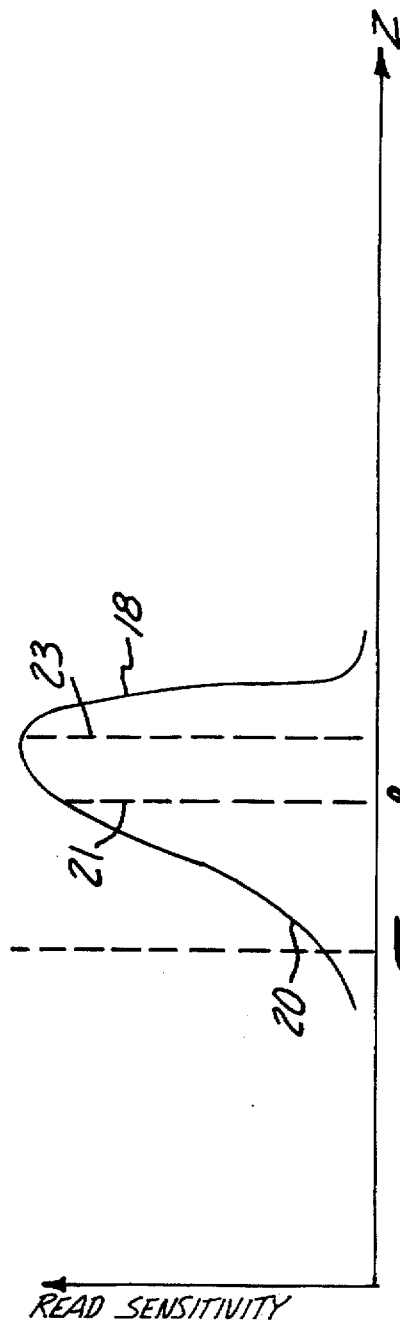

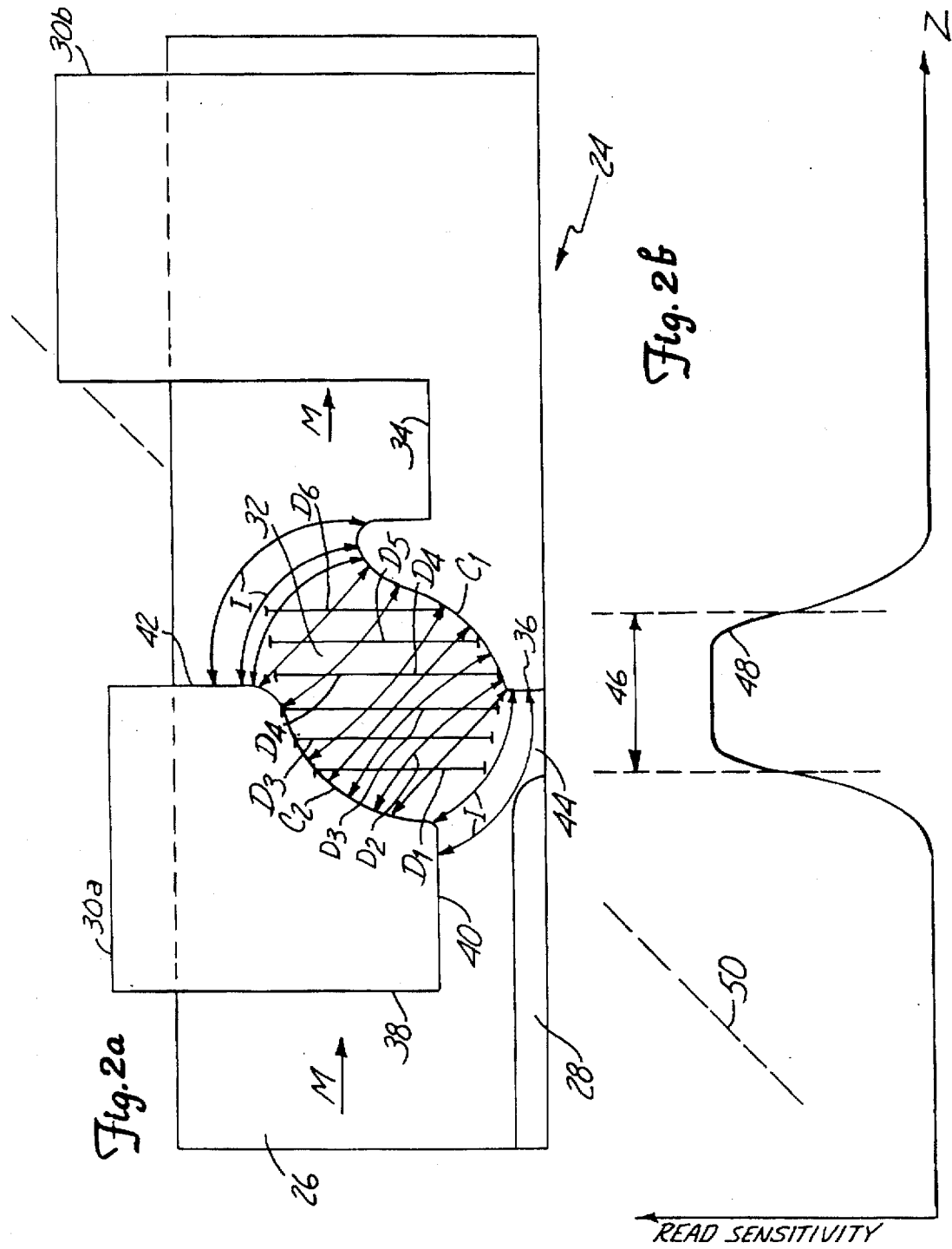

ized sensor in an application such as a magnetic disc drive in which the MR sensor may be required to read both data and
READ SENSITIVITY FUNCTION FOR BARBERPOLE BIAS DESIGN MAGNETORESISTIVE SENSOR HAVING CURVED CURRENT CONTACTS This is a continuation-in-part application of U.S. patent application, Ser. No. 08/188,079 filed on Jan. 27, 1994 now abandoned, which in turn is a continuation-in-part application of the U.S. patent application, Ser. No. 07/936,185 filed on Aug. 25, 1992 now abandoned.

BACKGROUND OF THE INVENTION

Magnetoresistive (MR) heads of the canted-current type are derived from a head type known as a barberpole MR head. The barberpole MR heads exhibit a skewed read sensitivity function due primarily to the variation and distance of the contact edges from the input surface. More particularly, the read sensitivity function is skewed because of the narrow corners between the contacts and the MR element. In a barberpole MR head design, the MR element is canted across a sensor at approximately 45°, creating a sense region where current vector I primarily flows perpendicular to the contact edges. Current vector I flows across the sense region at approximately 45° relative to the MR element magnetization vector M. However, due to the canted contact edges, there is a triangular region in which current flows at a shallower angle, more parallel with the MR elements magnetization vector M than at the center of the sense region. Due to magnetization rotation in the presence of sense current in this region, however, detection is still possible.

The presence of the triangular region results in the read sensitivity function of a barberpole MR head extending farther to the left than to the right and thus, producing a skewed read sensitivity function. The read sensitivity function discussed herein is the sensitivity of the sensor versus location across the sensor for a microtrack of recorded information less than one micrometer in width.

Significant problems arise when using an asymmetric MR sensor in an application such as a magnetic disc drive in which the MR sensor may be required to read both data and servo information from very narrow tracks on a magnetic disc surface. One such problem is noise and cross-talk because of the excessively long tail on the read sensitivity function. Another problem is the use of a sensor to read analog servo data. Due to the asymmetrical nature of the read sensitivity function, the response to servo data from left and right is not equivalent. Thus, special compensation is required to make the asymmetric MR sensor practical when it is used in this manner.

In order to make the read sensitivity function of a barberpole MR head more symmetric (i.e. rectangular), the prior art discloses deactivating the undesirable triangular region of the sensor by poisoning the MR element (Permalloy) by diffusion or ion implantation. Although this method does reduce some of the asymmetry of the barberpole MR head, a truly symmetrical read sensitivity function cannot be attained with the prior art.

SUMMARY OF THE INVENTION

The present invention is an MR element design which substantially eliminates the undesirable asymmetric characteristics of the read sensitivity function associated with a barberpole MR head. More particularly, the contacts of the MR head are curved so as to make the perpendicular decay distance between the contact edge and the front of the sensor element more constant across the active sensor area. A constant magnetic flux across the central region of the MR element results in a symmetrical read sensitivity function for the MR head.

With the curved contact design, the undesirable triangular region associated with prior art barberpole MR head designs is altered to improve the read sensitivity function. A "lip" extension is positioned adjacent the sensor area to enhance the symmetry of the read sensitivity function and eliminate reading farther to the left. A current bias angle superior than that available with the prior art is obtained. Due to elimination of the triangular region.

BRIEF DESCRIPTION OF THE DRAWINGS

FIG. 1a shows a plan view of a prior art canted-current MR sensor. (Also referred to as slanted contact or barberpole design).

FIG. 1b shows the read sensitivity function for the sensor of FIG. 1.

FIG. 2a shows a plan view of a magnetoresistive sensor in accordance to the present invention.

FIG. 2b shows the read sensitivity function of the sensor of FIG. 2a.

DETAILED DESCRIPTION OF THE PREFERRED EMBODIMENTS

Figure 3:
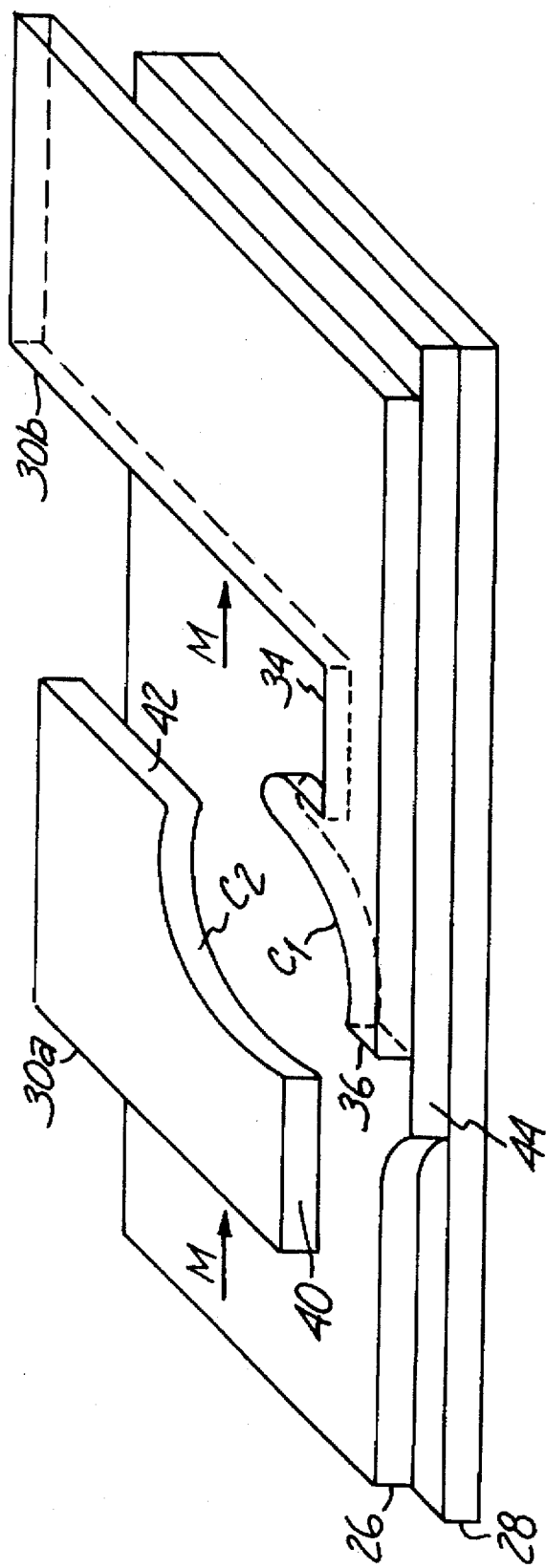
FIG. 3 show a prospective view of a magnetoresistive sensor in accordance to the present invention.

FIG. 1a shows a typical prior art barberpole MR head design in which MR element 10 extends left to right and contacts 12 are slanted across sensor 14 at approximately 45° and has an air-bearing surface 11. Generally, the sense current I flows perpendicular to the contact edges across the sense region at approximately 45° relative to the MR element's magnetization vector M. However, in the cross-hatched triangular region 16, current flows at a shallower angle which is more parallel with the MR element's magnetization vector M than at the center of the sense region. Because the output voltage of the MR sensor for any given input current is proportional to $COS^2\theta$, where $\theta$ is the angle between the static magnetization vector and the current vector, read sensitivity drops sharply when the angle between the magnetization vector M and the sense current varies from 45°. Thus, because of the shallower conduction angle in the triangular region, read sensitivity in this region is less than in other regions of the sensor.

FIG. 1b shows the read sensitivity function associated with the MR head in FIG. 1a. The read sensitivity function for the MR sensor is depicted as line 18. Due to the presence of the current vector I and the MR elements magnetization vector M in region 16, the read sensitivity function is asymmetric and exhibits a substantially large tail 20 extending to the left in the figure. Several techniques have been proposed to limit tail 20, such as prohibiting current flow in region 16 or poisoning the MR element in region 16. These techniques typically result in the read sensitivity line being chopped off to the left of line 21. However, note that between lines 21 and 23 the read sensitivity line continues to increase. This is because the active decay distance to increase between lines 23 and 24.

As used herein, decay length L(Z) refers to the distance that magnetic flux travels as it decays into an MR element. In FIG. 1, the decay length L(Z) is constant in the Z direction, as MR element 10 is rectangular. However, not all regions of the decay length contribute to read sensitivity. In FIG. 1a, read sensitivity is diminished in triangular region 16 because the sense current is not flowing at 45° with respect to the magnetization vector. Immediately to the right of triangular region 16, current flows at 45° with respect to the magnetization vector. The distance traversed by the flux in regions of MR element 10 having sense current flowing at 45° with respect to the magnetization vector increases as Z increases because of left contact 12. At line 23 in FIG. 1b, read sensitivity reaches a maximum because the distance traversed by the flux through a region having sense current flowing at 45° with respect to the magnetization vector is at a maximum, and none of the flux has to travel under right contact 12. To the right of line 23, the distance that flux must travel under right contact 12 increases as Z increases, and read sensitivity drops off rapidly.

Accordingly, the read sensitivity is based (in part) on the angle of the sense current with respect to the magnetization vector M, a first distance between air-bearing surface 11 and the beginning of sense current flow, and a second distance representing the length of MR element 10 having sense current through which flux travels. This second distance will be referred to herein as the "effective decay length" L'(Z) and is the distance that flux travels through that portion of an MR element having a sense current at 45° with respect to the magnetization vector of the MR element. As used herein, the term "effective decay segments" will refer to the effective decay lengths at various fixed values of Z. In FIGS. 1a and 1b, the maximum sensitivity at line 23 occurs when the current angle is 45°, the first distance is zero, and the effective decay segment is the distance from air bearing surface 11 to left contact 12.

Therefore, if one desired to design an MR sensor having a strong read response, with steep left and right hand sides and a flat top, one would want to provide current to the MR element at an angle of 45°, minimize the first distance between the air bearing surface and the beginning of sense current flow, provide approximately equal effective decay segments in the read detection window, and eliminate effective decay segments elsewhere.

The prior art sensor in FIG. 1a (as modified in U.S. patent application Ser. No. 07/936,185 to eliminate detection in triangular region 16) supplies current to MR element at 45° and has a first distance of zero over most of the read window, but does not have relatively equal effective decay segments across the read window. Therefore, the prior art sensor shown in FIG. 1a does not have relatively flat read sensitivity function in the read window. In FIG. 1a, effective decay segments are either bounded by a contact 12, air bearing surface 11, or MR element back edge 13.

The present invention provides an MR element having relatively equal effective decay segments because each segment is bounded at one end by a current contact, and at the other end by a region lacking current flow at substantially 45° with respect to the magnetization vector M. (However, at the very center of the MR element, effective decay segments may be bounded at each end by a current contact.)

FIG. 2a shows a preferred embodiment of a magnetoresistive head 24 made in accordance with the present invention, and FIG. 2b shows the read sensitivity function of head 24. FIG. 3 shows a prospective view of head 24. Fabrication steps for the production of the MR head are explained in the above-mentioned application Ser. No. 07/936,185. Basically, MR element 26 is layered upon a substrate 28, and back contact 30a and front contact 30b are layered upon MR element 26.

In the FIG. 2a, MR element 26 extends from left to right. Front contact 30b and back contact 30a are diagonally opposed to one another across sense region 32 on a surface of element 26. Front contact 30b includes lateral edge 34, curvature edge $C_1$ and edge 36. Back contact 30a includes edge 38, edge 40, curvature edge $C_2$, and edge 42. Active sensor region 32 is outlined as an elliptical area whose outer bounds are defined, in part, by curvatures $C_1$ and $C_2$, and the portions of MR element 26 that having sense current flowing at substantially 45° with respect to the magnetization vector M of element 26. Effective decay lengths D1–D6 are bounded by curvatures edges $C_1$ and $C_2$ and the portions of MR element 26 conducting sense current flowing at substantially 45° with respect to the magnitization vector M of element 26. Effective decay lengths D1–D6 are relatively constant.

Lip extension 44 of MR element 26 is patterned on substrate 28 and is approximately the same length as edge 36. Lip extension 44 defines the left edge of read detection window 46 in FIG. 2b. In addition, lip 44 provides a region where current I flows substantially parallel to vector M, thereby providing a region wherein detection does not occur. This region has approximately the same length as the region under contact 30b immediately to the right of edge 36. Therefore, lip 44 defines the left edge of the detection region and helps to match the left side of curve 48 to the right side.

Effective decay segments D1, D2, and D3 have lower bounds defined by the region where current flows substantially parallel to vector M. This current flow is provided by edge 36 (which is perpendicular to vector M) in combination with lip extension 44. The upper bounds of these segments are provided by edge $C_2$, which is also somewhat parallel to the vector M in the region between D1 and D2.

Effective decay segments D4, D5, and D6 have upper bounds defined by the region where current flows substantially parallel to vector M. This current flow is provided by edge 42 (which is perpendicular to vector M). The lower bounds of these segments are provided by edge $C_1$, which is also somewhat parallel to the vector M in the region between D4 and D6.

In other embodiments, contacts 30a and 30b could be moved closer so that edges 42 and 36 overlap, in which case segments in the overlapping regions would be bounded by contacts.

The novel contact arrangement shown in FIG. 2a (and FIG. 3) provides a relatively square read sensitivity function 48 in FIG. 2b. This function is achieved by using a 45° sense current to define a lower bound for effective decay segments and a curved contact to define an upper bound for effective decay segments on one end of the MR sensor, and using a 45° sense current to define an upper bound for effective decay segments and a curved contact to define a lower bound for effective decay segments on the other end of the MR sensor. Note that the contact arrangement is somewhat symmetrical with respect to diagonal line 50.

An MR head design in accordance with the present invention results in a symmetrical read sensitivity function. Curved sensor contacts produce constant effective magnetic flux decay lengths. The read sensitivity function obtained with the present invention is superior than that available with the prior art.

Although the present invention has been described with reference to preferred embodiments, workers skilled in the art will recognize that changes may be made in form and detail without departing from the spirit and scope of the invention.

What is claimed is:

1. A magnetoresistive sensor comprising:

a magnetoresistive element having a first surface to confront a magnetic medium and a second surface intersecting the first surface, the first surface having a recess defining an edge of a read detection window;

a first current contact having a curved edge contacting the second surface of the magnetoresistive element, the first contact being spaced from the first surface;

a second current contact having a curved edge contacting the second surface, the curved edge of the second current contact being spaced from and confronting the curved edge of the first current contact to define an active sensor region in the magnetoresistive element, the curved edges of the first and second current contacts being concave to form generally equal effective decay lengths.

2. The sensor of claim 1, wherein the first surface is substantially normal to the second surface and the first contact further includes a second edge joined to the curved edge of the first contact at a location spaced from the first surface.

3. The sensor of claim 2, wherein the second edge of the first contact is substantially straight and substantially parallel to the first surface.

4. The sensor of claim 2, wherein the second contact includes a second edge extending between the curved edge of the second contact and the first surface.

5. The sensor of claim 4, wherein the second edge of the second contact is substantially perpendicular to the first surface.

6. The sensor of claim 2, wherein the first contact further includes a third edge joined to the curved edge of the first contact, such that the curved edge of the first contact is between the second and third edges of the first contact.

7. The sensor of claim 1, wherein the curved edges of the first and second contacts are arranged to conduct current across the active sensor region at substantially 45° relative to a magnetization vector of the magnetoresistive element.

8. The sensor of claim 1, wherein the curved edges of the first and second contacts are disposed on the second surface generally 45° relative to a magnetization vector of the magnetoresistive element.

9. A magnetoresistive sensor comprising:

a magnetoresistive element having a first surface for confronting a magnetic medium, a recess in the first surface defining an edge of read detection window, the recess having a depth from the first surface, and a second surface intersecting and normal to the first surface;

a first electrical contact having a curved contact edge contacting the second surface, the first electrical contact being spaced from the first surface; and a second electrical contact having a curved contact edge contacting the second surface and spaced from and confronting the curved contact edge of the first electrical contact to define an active sensor region of the magnetoresistive element, the curved contact edges of the first and second electrical contacts being concave to the sensor region to form substantially equal effective decay lengths.

10. The magnetoresistive sensor of claim 9, wherein the first and second contact edges are arranged 45° relative to a magnetization vector of the magnetoresistive element.

11. The magnetoresistive sensor of claim 9, wherein the second contact includes a second contact edge on the second surface, the second edge extending between the curved contact edge of the second contact and the first surface and being substantially normal to the first surface.

12. The magnetoresistive sensor of claim 11, wherein the second contact edge has a length substantially equal to the distance between the edge of the read detection window and the second contact edge of the second contact.

13. The magnetoresistive sensor of claim 9, wherein the curved edges of the first and second contacts are arranged to conduct current across the active sensor region at substantially 45° relative to a magnetization vector of the magnetoresistive element.

14. The magnetoresistive sensor of claim 9 wherein the curved contact edge of the first contact extends between first and second substantially straight edges of the first contact, the first straight edge of the first contact being substantially parallel to the first surface and the second straight edge of the first contact being substantially normal to the first surface.

15. The magnetoresistive sensor of claim 14, wherein the second current contact includes a second edge which is substantially straight and substantially normal to the first surface to define a parallel conduction region between the first straight edge of the first current contact and the second edge of the second current contact, the parallel conduction region for conducting current substantially parallel to a magnetization vector of the magnetoresistive element.

* * * * *

UNITED STATES PATENT AND TRADEMARK OFFICE
CERTIFICATE OF CORRECTION

PATENT NO. : 5,682,284

DATED : OCTOBER 28, 1997

INVENTOR(S) : PETER K. GEORGE

It is certified that error appears in the above-indentified patent and that said Letters Patent is hereby corrected as shown below:

Col. 2, line 65, delete "1", insert --1a--

Col. 3, line 8, after "of", insert --the slant of--

Col. 3, line 36, delete "air bearing", insert --air-bearing--

Col. 4, line 13, delete "flowing"

Signed and Sealed this

Twenty-third Day of June, 1998

Attest:

Attesting Officer

BRUCE LEHMAN

Commissioner of Patents and Trademarks